United States Patent
Kikuchi et al.

(10) Patent No.: US 7,794,617 B2
(45) Date of Patent: Sep. 14, 2010

(54) PLASMA ETCHING METHOD, PLASMA PROCESSING APPARATUS, CONTROL PROGRAM AND COMPUTER READABLE STORAGE MEDIUM

(75) Inventors: Akihiro Kikuchi, Nirasaki (JP); Takashi Tsunoda, Kofu (JP); Yuichiro Sakamoto, Fuchu (JP)

(73) Assignee: Tokyo Electron Limited, Tokyo (JP)

( * ) Notice: Subject to any disclaimer, the term of this patent is extended or adjusted under 35 U.S.C. 154(b) by 688 days.

(21) Appl. No.: 11/689,629

(22) Filed: Mar. 22, 2007

(65) Prior Publication Data

US 2007/0287297 A1    Dec. 13, 2007

Related U.S. Application Data

(60) Provisional application No. 60/788,110, filed on Apr. 3, 2006.

(30) Foreign Application Priority Data

Mar. 23, 2006  (JP)  ............................. 2006-080464

(51) Int. Cl.
*C03C 15/00* (2006.01)
(52) U.S. Cl. ............................. 216/67; 216/37; 216/74; 216/79; 438/701; 438/706; 438/714; 438/723

(58) Field of Classification Search ............... 216/67, 216/37, 74, 79; 438/706, 710, 714, 723
See application file for complete search history.

(56) References Cited

U.S. PATENT DOCUMENTS

| 5,830,807 | A | 11/1998 | Matsunaga et al. |
| 6,218,309 | B1 * | 4/2001 | Miller et al. ................. 438/700 |
| 7,622,051 | B1 * | 11/2009 | Schaefer et al. ................ 216/67 |
| 2006/0032833 | A1 * | 2/2006 | Kawaguchi et al. ........... 216/37 |

FOREIGN PATENT DOCUMENTS

JP    2006-41554    2/2006

* cited by examiner

*Primary Examiner*—Lan Vinh
*Assistant Examiner*—Maki A Angadi
(74) *Attorney, Agent, or Firm*—Oblon, Spivak, McClelland, Maier & Neustadt, L.L.P.

(57) ABSTRACT

A plasma etching method includes the step of: etching a silicon layer of a target object by using a plasma generated from a processing gas containing a fluorocarbon gas, a hydrofluorocarbon gas, a rare gas and an $O_2$ gas and by employing a patterned resist film as a mask. The target object includes the silicon layer whose main component is silicon and the patterned resist film formed over the silicon layer.

20 Claims, 12 Drawing Sheets

PLASMA ETCHING METHOD, PLASMA PROCESSING APPARATUS, CONTROL PROGRAM AND COMPUTER READABLE STORAGE MEDIUM

FIELD OF THE INVENTION

The present invention relates to a plasma etching method including a process for etching a target object by using a plasma.

BACKGROUND OF THE INVENTION

In a manufacturing process of a semiconductor device, a process for etching a laminated film by using a mask such as a patterned resist film is repeatedly performed. For example, in a manufacturing process of a gate electrode, laminated on a semiconductor substrate in order from the bottom are a silicon oxide film or a silicon nitride film serving as a gate insulating film, a polycrystalline silicon layer serving as a gate electrode, a hard mask layer formed of silicon nitride or the like, an anti-reflection film formed of silicon oxide or the like, and a resist film. Further, the anti-reflection film and the hard mask layer are dry-etched by using the resist film patterned by employing a photolithography technique as a mask. After the resist film is removed by ashing, the polycrystalline silicon layer is etched by using the hard mask layer as a mask, thereby forming the gate electrode.

Herein, an exclusive plasma etching apparatus for etching an insulating film is used to etch the anti-reflection film and the hard mask layer, while an exclusive plasma etching apparatus for etching silicon is used to etch the polysilicon. Further, the removal of the resist film by ashing is performed by using an exclusive ashing apparatus.

On the other hand, in case of forming shallow trench isolation (STI) by forming a trench for device isolation in a silicon substrate, for example, laminated on a silicon substrate in order from the bottom are a silicon oxide film, a silicon nitride film, a silicon oxynitride (SiON) film, an oxide mask layer and a resist film. Then, the oxide mask layer, the silicon oxynitride (SiON) film, the silicon nitride film and the silicon oxide film are etched by using the resist film patterned by employing a photolithography technique as a mask. Then, the silicon substrate is etched by using the oxide mask layer, the silicon oxynitride (SiON) film and the silicon nitride film as a mask, thereby forming the trench in the silicon substrate. Also in this case, an exclusive etching apparatus for etching an insulating film is also used to etch the oxide mask layer, the silicon oxynitride (SiON) film, the silicon nitride film, and the silicon oxide film, while an exclusive etching apparatus for etching silicon is used to etch the silicon substrate. Furthermore, the removal of the resist film by ashing is performed by using an exclusive ashing apparatus.

As described above, a conventional etching process requires at least two etching steps. To be more specific, the resist pattern is first transcribed to the hard mask layer by etching the hard mask layer by using the resist film, and then the silicon substrate is etched by using the hard mask layer. This is because, in case of etching the silicon by using the resist film as a mask, a selectivity against the mask is not high enough and a high etching rate could not be obtained. Furthermore, an etching shape such as a sidewall angle or a critical dimension (CD) of the trench becomes changed depending on a pattern density of line and space, or a position on a surface of a semiconductor wafer, e.g., a central portion or a peripheral portion thereof.

Further, the gas system used for etching the insulating film differs from that used for etching the silicon, a corrosive gas is most commonly used in the silicon etching, and the etching accuracy is deteriorated by the mixing of the etching gases of the insulating film and silicon. As a result, it has been a necessary common practice to selectively use the exclusive etching apparatus for etching an insulating film and the exclusive etching apparatus for etching silicon depending upon the etching target (see, for example, Japanese Patent Laid-open Application No. H7-263415, paragraphs 0006 to 0010).

SUMMARY OF THE INVENTION

It is, therefore, an object of the present invention to provide a plasma etching method capable of etching a silicon layer in a laminated film by using a resist film as a mask, while ensuring a sufficient selectivity against the mask and etching rate.

Another object of the present invention is to provide a plasma etching method capable of preventing an etching shape from being changed depending on a pattern density or a position on a target object.

In accordance with a first aspect of the present invention, there is provided a plasma etching method including the step of: etching a silicon layer of a target object by using a plasma generated from a processing gas containing a fluorocarbon gas, a hydrofluorocarbon gas, a rare gas and an $O_2$ gas and by employing a patterned resist film as a mask, wherein the target object includes the silicon layer whose main component is silicon and the patterned resist film formed over the silicon layer.

In accordance with a second aspect of the present invention, there is provided a plasma etching method including the step of: etching a silicon nitride film, a silicon oxide film, and a silicon layer of a target object at a stretch by using a plasma generated from a processing gas containing a fluorocarbon gas, a hydrofluorocarbon gas, a rare gas and an $O_2$ gas and by employing a patterned resist film as a mask in a processing chamber of a plasma processing apparatus, wherein the target object includes the silicon layer whose main component is silicon, and at least the silicon oxide film, the silicon nitride film and the patterned resist film laminated over the silicon layer.

In the first and the second aspect of the invention, it is preferable that the fluorocarbon gas is a $CF_4$ gas, a $C_2F_6$ gas, a $C_3F_8$ gas, or a $C_4F_8$ gas. Further, it is preferable that the hydrofluorocarbon gas is a $CHF_3$ gas, a $CH_2F_2$ gas, or a $CH_3F$ gas. Further, it is preferable that a flow rate of the fluorocarbon gas is 10-50 mL/min. Further, it is preferable that a flow rate of the $O_2$ gas is 1-30 mL/min. Further, it is preferable that a flow rate ratio of the hydrofluorocarbon gas to the rare gas (hydrofluorocarbon gas flow rate/rare gas flow rate) is 0.019-0.173. Further, it is preferable that a processing pressure is 8-12 Pa.

Further, in the first and the second aspect of the invention, it is preferable that critical dimensions after respectively etching in a dense pattern region and in a sparse pattern region are controlled by a flow rate of the fluorocarbon or $O_2$ gas. Further, it is preferable that a critical dimension after etching in a surface of the target object is controlled by a flow rate of the fluorocarbon gas.

Further, in the second aspect of the invention, it is preferable that a processing pressure in etching the silicon layer is lower than that in etching the silicon nitride film or a flow rate of the hydrofluorocarbon gas in etching the silicon layer is lower than that in etching the silicon nitride film.

Further, in the first and second aspect of the invention, it is preferable that the silicon layer is mainly made of polycrystalline silicon or single crystalline silicon.

In accordance with a third aspect of the present invention, there is provided a control program executable on a computer for controlling, when executed, a plasma processing apparatus to perform the plasma etching method of the first or the second aspect of the invention.

In accordance with a fourth aspect of the present invention, there is provided a computer readable storage medium for storing a computer executable control program, wherein the control program controls, when executed, a plasma processing apparatus to perform the plasma etching method of the first or the second aspect of the invention.

In accordance with a fifth aspect of the present invention, there is provided a plasma processing apparatus including: a processing chamber for performing a plasma etching process on a target object; a support for mounting the target object thereon in the processing chamber; a gas exhaust unit for depressurizing the processing chamber; a gas supply unit for supplying a processing gas into the processing chamber; and a controller for controlling the plasma etching method of the first or the second aspect of the invention to be performed in the processing chamber.

By using the processing gas including the fluorocarbon gas, the hydrofluorocarbon gas, the rare gas and the $O_2$ gas in accordance with the plasma etching method of the present invention, the silicon etching can be performed by using the resist film as a mask while ensuring a sufficient etching rate.

Furthermore, by adjusting the fluorocarbon or $O_2$ gas flow rate, the inclination angle difference of the sidewall of the etched groove caused by a difference in the pattern density and the critical dimension difference after etching caused by a difference in the position on the target object can be eliminated, thereby resulting in the uniformity of the etching shape.

Accordingly, the plasma etching method of the present invention can greatly reduce the number of the processing steps and the processing time in the silicon etching process. Furthermore, since the uniformity of the etching shape can be realized by the plasma etching method of the present invention, the present invention can be advantageously applied to the fabrication of a highly reliable semiconductor device, and cope with a trend toward the miniaturization and the high integration in the design rule of the semiconductor device.

BRIEF DESCRIPTION OF THE DRAWINGS

The above and other objects and features of the present invention will become apparent from the following description of preferred embodiments given in conjunction with the accompanying drawings, in which:

FIGS. 9A to 9C show a sample wafer used in an experiment, wherein FIG. 9A shows a cross section thereof before etching, FIG. 9B shows a cross section thereof after etching, and FIG. 9C shows measuring positions of CDs on a surface of the sample wafer;

DETAILED DESCRIPTION OF THE EMBODIMENTS

Hereinafter, embodiments of the present invention will be described in detail with reference to the accompanying drawings so that they can be readily implemented by those skilled in the art.

Figure 1:
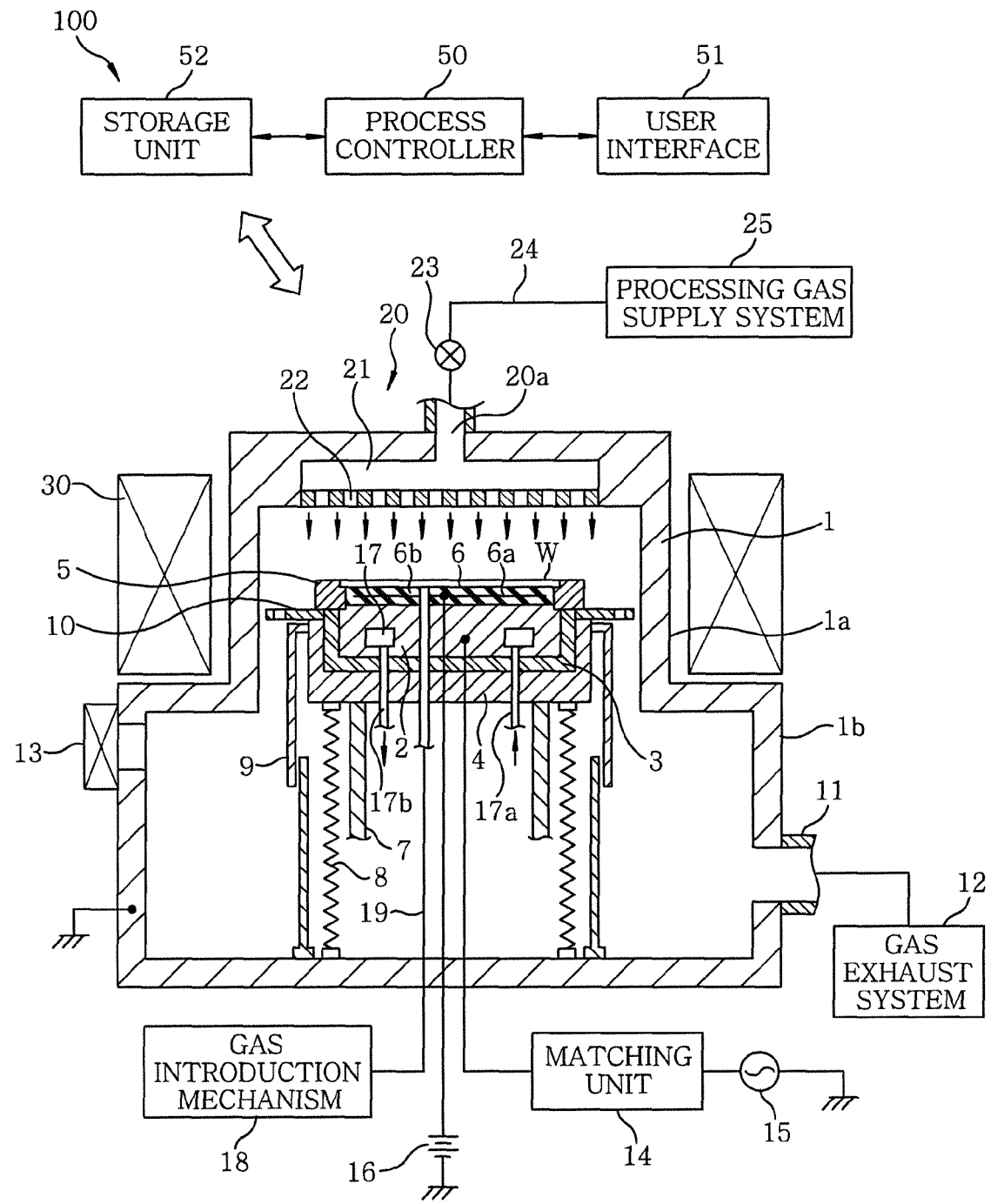
FIG. 1 is a cross sectional view of a magnetron RIE plasma etching apparatus for appropriately executing a method of the present invention.

FIG. 1 is a cross sectional view for schematically showing a magnetron RIE plasma etching apparatus 100 for appropriately executing a plasma etching method in accordance with the present invention. The plasma etching apparatus 100 is of an airtight configuration and has a chamber (processing vessel) 1 made of, e.g., aluminum, whose wall is of a stepped cylindrical shape formed of an upper portion 1a having a smaller diameter and a lower portion 1b having a larger diameter.

In the chamber 1, a supporting table 2 is formed to horizontally support a semiconductor wafer (hereinafter, referred to as a "wafer") W of a single crystalline Si substrate serving as a target object. The supporting table 2 is formed of, e.g., aluminum, and supported by a support unit 4 made of a conductor through an insulating plate 3. Furthermore, a focus ring 5 made of a material other than Si, e.g., quartz, is formed on an upper periphery of the supporting table 2. The supporting table 2 and the support unit 4 can be vertically moved upward and downward by a ball screw mechanism including ball screws 7, and a driving portion under the support unit 4 is covered with a bellows 8 made of stainless steel (SUS). A bellows cover 9 is formed outside the bellows 8. A baffle plate 10 is provided outside the focus ring 5, and further, the focus ring 5 is electrically connected to the process chamber 1 through the baffle plate 10, the support unit 4 and the bellows 8. Furthermore, the chamber 1 is grounded.

A gas exhaust port 11 is formed on a sidewall of the lower portion 1b of the chamber 1 and connected to a gas exhaust unit 12. Further, by operating a vacuum pump of the gas exhaust unit 12, a pressure in the process chamber 1 can be reduced to a specific vacuum level. Meanwhile, a gate valve 13 for opening/closing a loading/unloading gate of the wafer W is provided on an upper part of the lower portion 1b of the chamber 1.

A high frequency power supply 15 for generating plasma is connected to the supporting table 2 through a matching unit 14, and a high frequency power of a specific frequency, e.g., 13.36 MHz, is supplied from the high frequency power supply 15 to the supporting table 2. In addition, a shower head 20, which is provided above the supporting table 2 to face it in parallel, is grounded. Therefore, the supporting table 2 and the shower head 20 function as a pair of electrodes.

An electrostatic chuck 6 for electrostatically attracting the wafer W to be held thereby is formed on a surface of the supporting table 2. The electrostatic chuck 6 is formed by interposing an electrode 6a in an insulator 6b, and the electrode 6a is connected to a DC power supply 16. Further, by applying a voltage from the DC power supply 16 to the electrode 6a, the wafer W is attracted to be held thereat by an electrostatic force, e.g., a Coulomb force.

The supporting table 2 has a coolant chamber 17 therein, and a coolant is introduced into the coolant chamber 17 to be circulated therethrough via a coolant introducing line 17a and discharged therefrom through a coolant discharge line 17b. Therefore, cold heat is transferred to the wafer W through the supporting table 2, whereby a processing surface of the wafer W is controlled to be maintained at a desired temperature.

Moreover, although the chamber 1 is vacuum pumped by the gas exhaust unit 12 to be maintained at a vacuum state, a cooling gas is introduced between the surface of the electrostatic chuck 6 and a backside of the wafer W through a gas supply line 19 by a gas introduction mechanism 18 so that the wafer W can be effectively cooled by the coolant circulating in the coolant chamber 17. By introducing the cooling gas therein, cold heat of the coolant is efficiently transferred to the wafer W, thereby improving the cooling efficiency of the wafer W. As the cooling gas, a He gas or the like can be used.

The shower head 20 is disposed to face the supporting table 2 in a ceiling portion of the chamber 1. A plurality of gas discharge openings 22 is formed on a lower surface of the shower head 20, and a gas inlet unit 20a is formed on an upper portion thereof. In addition, a space 21 is formed in the shower head 20. A gas supply line 24 having a valve 23 is connected to the gas inlet unit 20a, and a processing gas supply system 25 for supplying a processing gas formed of an etching gas and a dilution gas is connected to the other end portion of the gas supply line 24.

Figure 2:
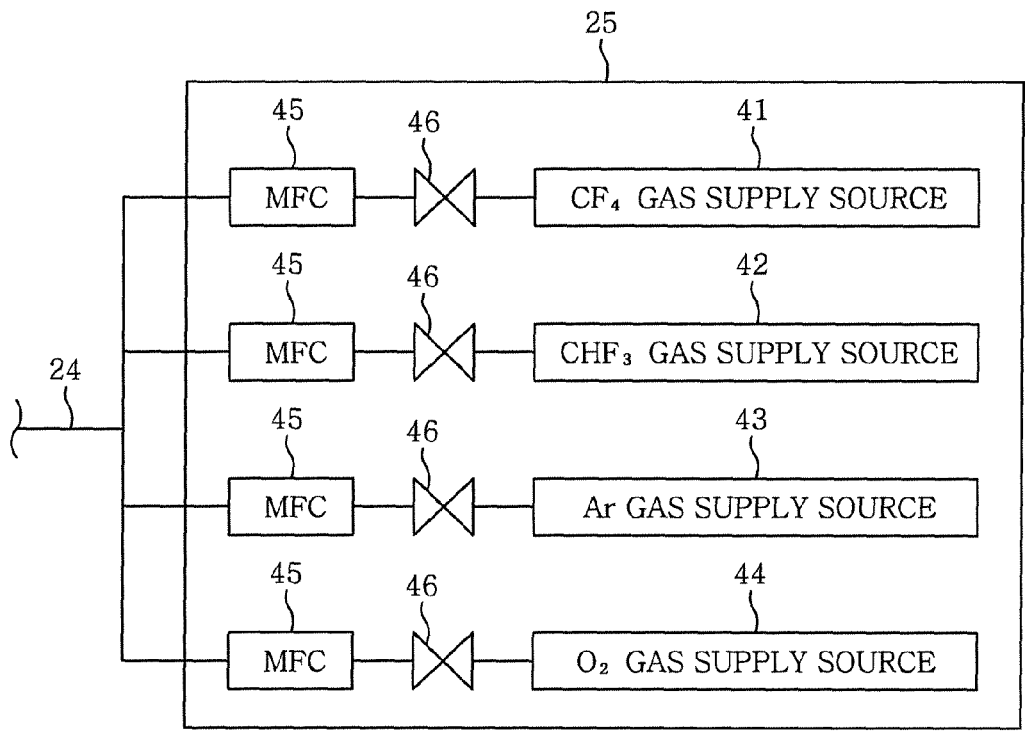
FIG. 2 is a configuration view of a processing gas supply system shown in FIG. 1.

As shown in FIG. 2, the processing gas supply system 25 includes a $CF_4$ gas supply source 41, a $CHF_3$ gas supply source 42, an Ar gas supply source 43, and an $O_2$ gas supply source 44, each of which is provided with a mass flow controller 45 and a valve 46 in a line from each gas source. Further, a $CF_4$ gas, a $CHF_3$ gas, an Ar gas and an $O_2$ gas, which are serving as an etching gas, supplied from respective gas supply sources of the processing gas supply system 25 reach the space 21 in the showerhead 20 via the gas supply line 24 and the gas inlet unit 20a and are then discharged through each gas discharge opening 22.

Figure 3:
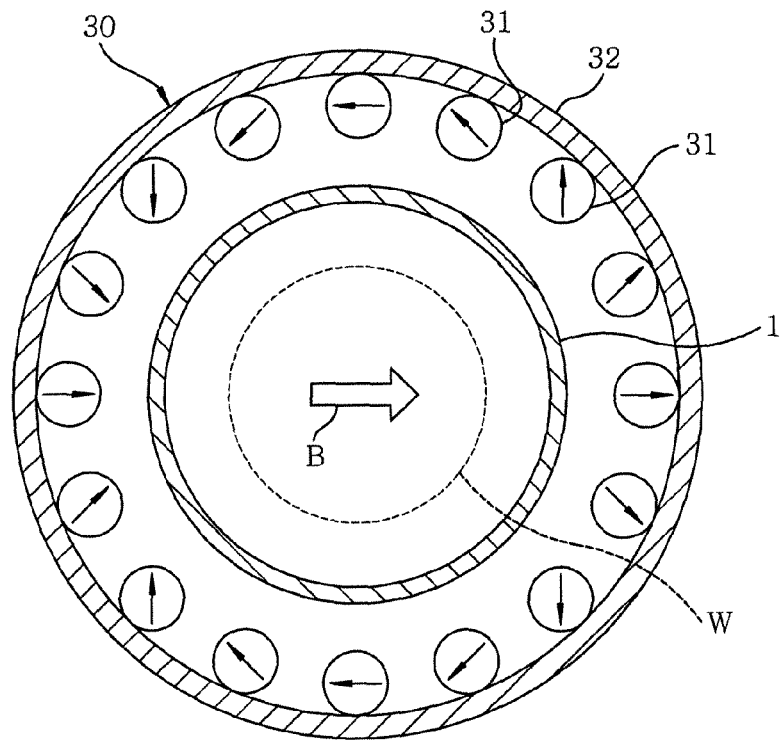
FIG. 3 is a horizontal cross sectional view for schematically showing a dipole ring magnet disposed around a periphery of a chamber of the apparatus shown in FIG. 1.

In the meantime, a dipole ring magnet 30 is disposed around a periphery of the upper portion 1a of the chamber 1. As shown in a horizontal cross sectional view of FIG. 3, the dipole ring magnet 30 is formed by attaching a plurality of columnar anisotropic segment magnets 31 to a ring-shaped magnetic material case 32. In this example, sixteen columnar anisotropic segment magnets 31 which form columns are arranged in a ring shape. In FIG. 3, arrows shown in the columnar anisotropic segment magnets 31 indicate magnetization directions. As shown in FIG. 3, by making the magnetization directions of the plurality of columnar anisotropic segment magnets 31 slightly different from each other, a uniform horizontal magnetic field B directed in one direction as a whole can be formed.

Figure 4:
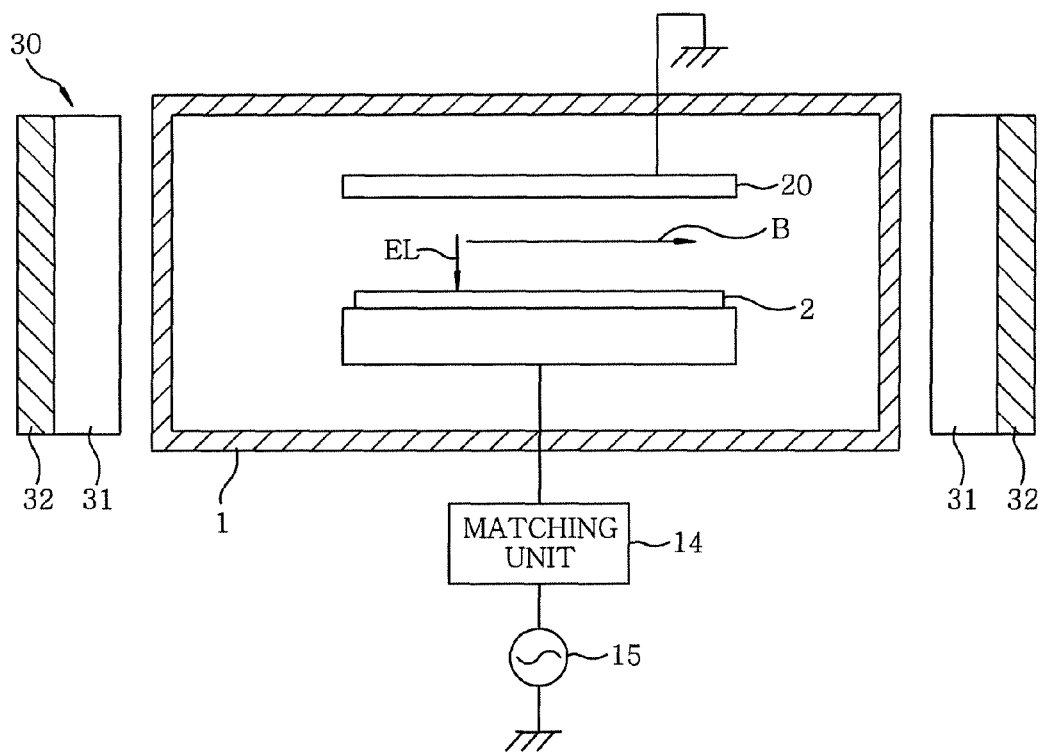
FIG. 4 is a schematic view for explaining an electric field and a magnetic field formed in the chamber.

Therefore, as schematically shown in FIG. 4, an electric field EL in a vertical direction is formed in a space between the supporting table 2 and the shower head 20 by the high frequency power supply 15, and further, the horizontal magnetic field B is formed by the dipole ring magnet 30. Consequently, a magnetron discharge is generated by an orthogonal electromagnetic field formed in this manner. Thereby, a plasma of the etching gas in a high-energy state is generated to be used in etching the wafer W.

Further, each component of the plasma etching apparatus 100 is connected to and controlled by a process controller 50 with a CPU. The process controller 50 is connected to a user interface 51 including a keyboard with which a process manager executes command input manipulation in order to manage the plasma etching apparatus 100, a display which visualizes and displays an operation status of the plasma etching apparatus 100, and the like.

Moreover, also connected to the process controller 50 is a storage unit 52 for storing therein recipes which record control programs, processing condition data and the like to be used in realizing various processes performed in the plasma etching apparatus 100 under the control of the process controller 50.

Further, if necessary, when a command is received from the user interface 51, a necessary recipe is retrieved from the storage unit 52 to be executed by the process controller 50, whereby a desired processing in the plasma etching apparatus 100 is performed under the control of the processing controller 50. Moreover, the recipes can be retrieved from a computer-readable storage medium such as a CD-ROM, a hard disc, a flexible disc, a flash memory or the like, or also can be transmitted from other devices via, e.g., a dedicated line on occasion.

Hereinafter, a plasma etching method of the present invention for plasma etching the wafer W, which has a silicon layer (single crystalline silicon or polysilicon), will be described by using the plasma etching apparatus 100.

First, the wafer W is loaded into the chamber 1 by opening the gate valve 13 to be mounted on the supporting table 2. Next, the supporting table 2 is moved upward to a position shown in FIG. 1, and thereafter, the inside of the chamber 1 is vacuum pumped through the gas exhaust port 11 by using the vacuum pump of the gas exhaust unit 12.

Then, under a condition where the processing gas formed of an etching gas and a dilution gas is introduced at a specific flow rate from the processing gas supply system 25 into the chamber 1, and the inside of the chamber 1 is set at a specific pressure, a specific high frequency power is supplied from the high frequency power supply 15 to the supporting table 2. At this time, the wafer W is attracted to be held on the electrostatic chuck 6 by a specific voltage applied from the DC power supply 16 to the electrode 6a of the electrostatic chuck 6, for example, by the Coulomb force, and a high frequency electric field is formed between the shower head 20 serving as an upper electrode and the supporting table 2 serving as a lower electrode. Since the horizontal magnetic field B is formed between the shower head 20 and the support table 2 by the dipole ring magnet 30, the orthogonal electromagnetic field is formed in the processing space between the electrodes where the wafer W is located, and the drift of electrons caused by the orthogonal electromagnetic field generates a magnetron discharge. Therefore, the wafer W is etched by a plasma of the etching gas formed by the magnetron discharge.

In order to make a sufficient selectivity against the mask and etching rate be surely achieved and to control the etching shape, it is preferable to use gases including a $CF_4$ gas, a $CHF_3$ gas, an Ar gas and an $O_2$ gas as the etching gas. The $CF_4$ gas is speculated to produce F radicals (F*) which primarily contribute to the etching by the reaction which generally occurs in the plasma, as shown in $CF_4 \rightarrow CF_3^* + F^*$. The F radicals react with the silicon oxide film, the silicon nitride film and the silicon layer as shown in the following reaction equations 1 to 3, thereby performing the etching process.

$$SiO_2 + 4F^* \rightarrow SiF_4\uparrow + O_2 \quad \text{(Reaction 1)}$$

$$Si_3N_4 + 12F^* \rightarrow 3SiF_4\uparrow + 2N_2\uparrow \quad \text{(Reaction 2)}$$

$$Si + 4F^* \rightarrow SiF_4\uparrow \quad \text{(Reaction 3)}$$

The $CHF_3$ gas added to the $CF_4$ gas generates an HF to decrease the F radical, and at the same time, forms a CH or CF polymer functioning as a protective layer to enhance the selectivity against the resist film.

The Ar gas not only accelerates the dissociation reaction which generates the F radical, but also maintains a uniform distribution of the radical in the plasma. Further, the Ar gas removes a film where an etching reaction occurs by a sputtering method.

Furthermore, the $O_2$ gas has a function of preventing the CH or CF based polymer from being excessively accumulated on a bottom of an etched groove or hole.

In order to form a good etching shape, it is effective to control the temperature of the wafer W. The coolant chamber 17 is installed for this reason. A coolant is circulated in the coolant chamber 17, and the cold heat is transferred to the wafer W through the supporting table 2, whereby the processing surface of the wafer W is controlled to be at a desired temperature.

A frequency and a power of the high frequency power supply 15 for generating plasma are appropriately set to generate a desired plasma. In order to increase a plasma density directly above the wafer W in case of etching silicon, for example, it is preferable to set the frequency to be equal to or greater than 13.56 MHz.

To increase the plasma density directly above the wafer W, the dipole ring magnet 30 is provided to form a magnetic field in the processing space between the supporting table 2 and the shower head 20 serving as the facing electrodes. Further, in order to achieve maximum effect, it is desirable to use a magnet whose magnetic field strength is at least 10,000 μT (100 G). Although, as the magnetic field becomes stronger, the effect of increasing the plasma density is considered to be enhanced, it is preferable to use a magnetic field strength of equal to or less than 100,000 μT (1 kG) in view of safety.

Preferable conditions for etching the laminated films at a stretch by using the plasma etching apparatus 100 are as follows.

For example, as for the flow rate of the processing gas, the flow rate of the $CF_4$ gas is set to be 10~50 mL/min (sccm) and, preferably, 20~40 mL/min (sccm), the flow rate of the $CHF_3$ gas is set to be 10~100 mL/min (sccm) and, preferably, 20~70 mL/min (sccm), the flow rate of the Ar gas is set to be 100~2000 mL/min (sccm) and, preferably, 300~1200 mL/min (sccm), and the flow rate of the $O_2$ gas is set to be 1-30 mL/min (scam) and, preferably, 6~15 mL/min (scam).

Furthermore, in order to ensure an etching rate and a uniformity of the etching shape, i.e. to suppress an inclination angle difference of the sidewall of the etched groove caused by a difference in the pattern density and a critical dimension by the position in the wafer surface, the flow rate ratio of a gaseous mixture of $CF_4/CHF_3/Ar/O_2$ is preferably set at 1~3/2~4/20~40/0.5~2.

The processing pressure preferably ranges from 1.3 to 40 Pa and, more preferably, ranges from 5 to 13.3 Pa in order to obtain an etching selectivity of the silicon oxide film, the silicon nitride film and the silicon layer against the mask.

Furthermore, to increase the dissociation degree of the etching gas, the frequency of the high frequency wave of the high frequency power supply 15 is preferably set at 13.56 MHz, and the high frequency power is preferably set to be such that the high frequency power divided by a surface area of the substrate ranges from 300 W to 500 W (0.96 W/cm²~1.59 W/cm²).

In addition, to appropriately control the etching shape, i.e. etching anisotropy, the temperature of the wafer W is preferably set within the range from 40° C. to 70° C.

First Embodiment

Figure 5:
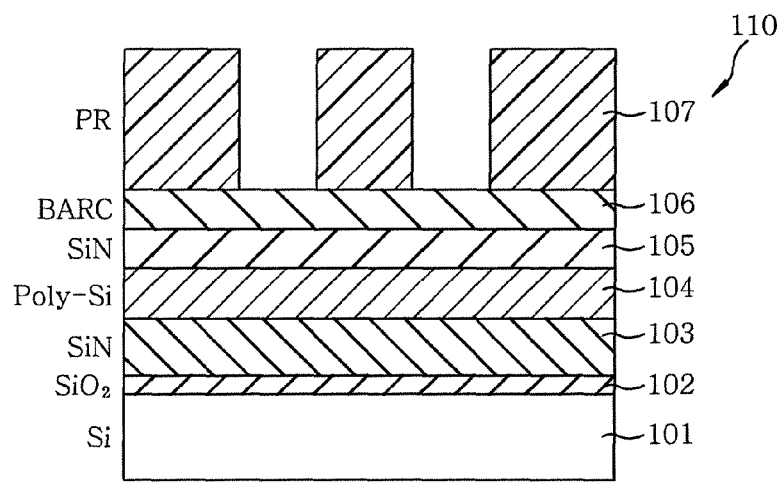
FIG. 5 is a cross sectional configuration view for schematically showing a laminated structure of a semiconductor wafer to which the method of the present invention is applied.

FIG. 5 is a cross sectional configuration view for schematically showing a target object 110 such as the semiconductor wafer W to which a plasma etching method in accordance with a first embodiment of the present invention is applied. The target object 110 includes a silicon oxide film ($SiO_2$ film) 102, a silicon nitride film ($Si_3N_4$ film) 103, a polycrystalline silicon layer 104, a silicon nitride film ($Si_3N_4$ film) 105 and an inorganic anti-reflection film (BARC) 106 formed in order from the bottom on a silicon substrate 101. Further, a patterned resist film (PR) 107 is formed on the anti-reflection film 106. This etching process is a single process for forming a gate electrode by using the polycrystalline silicon layer 104 as an electrode layer. Herein, the silicon oxide film ($SiO_2$ film) 102 and the silicon nitride film ($Si_3N_4$ film) 103 serve as a gate insulating film.

In the conventional etching method applied to the target object 110 shown in FIG. 5, the anti-reflection film 106 and the silicon nitride film ($Si_3N_4$ film) 105 are first etched by using the resist film (PR) 107 as a mask, and the resist film (PR) 107 is removed by ashing. After that, the polycrystalline silicon layer 104 is etched by using the silicon nitride film ($Si_3N_4$ film) 105 as a hard mask. Further, an exclusive plasma etching apparatus for etching an insulating film is used to etch the anti-reflection film 106 and the silicon nitride film ($Si_3N_4$ film) 105, while an exclusive plasma etching apparatus for etching silicon is used to etch the polycrystalline silicon layer 104. Furthermore, the removal of the resist film (PR) 107 by ashing is performed by using an exclusive ashing apparatus.

Figure 6:
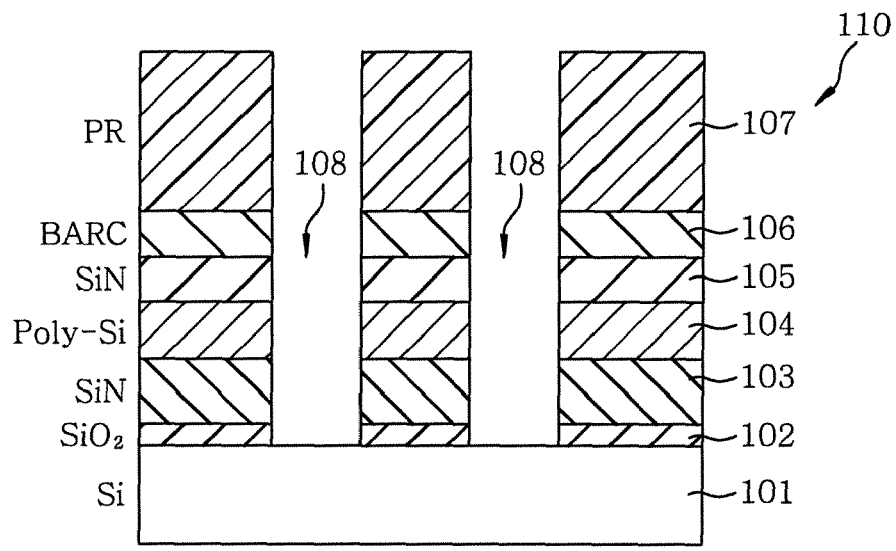
FIG. 6 shows a cross section of the etched semiconductor wafer.

In contrast, in accordance with the plasma etching method of the preferred embodiment, the plasma etching apparatus 100 uses a processing gas including a fluorocarbon gas, a hydrofluorocarbon gas, a rare gas and an $O_2$ gas, for example, a gaseous mixture of $CF_4/CHF_3/Ar/O_2$. Further, by using the pattern of the resist film (PR) 107 serving as a mask, the etching of the anti-reflection (BARC) film 106, the silicon nitride ($Si_3N_4$) film 105, the polycrystalline silicon layer 104, the silicon nitride film ($Si_3N_4$ film) 103 and the silicon oxide ($SiO_2$) film 102 is performed at a stretch. By etching the laminated films at a stretch, a recess 108 shown in FIG. 6 can be formed by performing a single step etching process.

Second Embodiment

Figure 7:
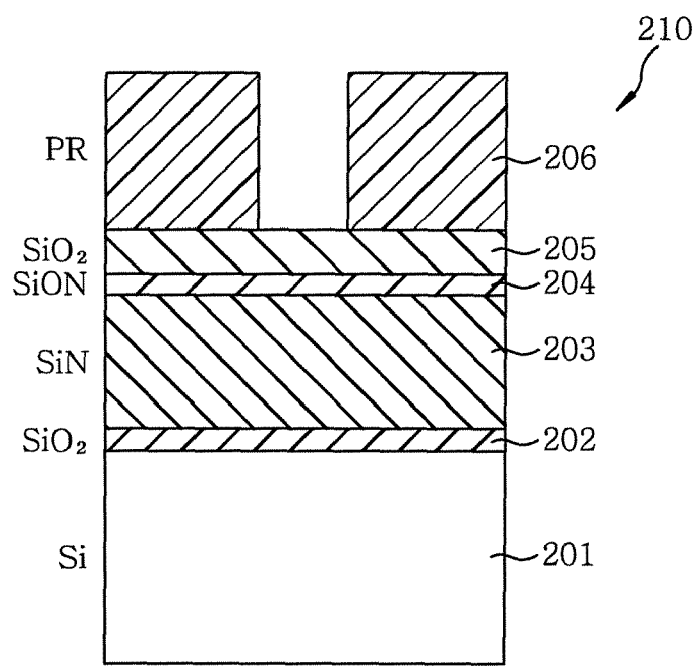
FIG. 7 is a cross sectional configuration view for schematically showing a laminated structure of a semiconductor wafer of another example to which the method of the present invention is applied.

FIG. 7 is a cross sectional configuration view for schematically showing a target object 210 such as a semiconductor wafer to which a plasma etching method in accordance with the second embodiment is applied. The target object 210 includes a silicon oxide ($SiO_2$) film 202, a silicon nitride ($Si_3N_4$) film 203, a silicon oxynitride (SiON) film 204, and a silicon oxide ($SiO_2$) film 205 formed in that order from the bottom on a silicon substrate 201. Further, a patterned resist film (PR) 206 is formed on the silicon oxide ($SiO_2$) film 205. This etching process is a single process for forming a trench 207 for burying therein an insulating film in the silicon substrate 201 by way of STI.

In the conventional etching method applied to the target object 210 shown in FIG. 7, the silicon oxide ($SiO_2$) film 205, the silicon oxynitride (SiON) film 204, the silicon nitride ($Si_3N_4$) film 203 and the silicon oxide ($SiO_2$) film 202 are first etched by using the resist film (PR) 206 as a mask, and then, the resist film (PR) 206 is removed by ashing. After that, the silicon substrate 201 is etched by using the silicon oxide film ($SiO_2$ film) 205, the silicon oxynitride film (SiON) 204, and the silicon nitride film ($Si_3N_4$ film) 203 as a mask. Further, an exclusive etching apparatus for etching an insulating film is used to etch the silicon oxide ($SiO_2$) film 205, the silicon oxynitride (SiON) film 204, the silicon nitride ($Si_3N_4$ film) film 203 and the silicon oxide ($SiO_2$) film 202, while an exclusive etching apparatus for etching silicon is used to etch the silicon substrate 201. Furthermore, the removal of the resist film (PR) 206 by ashing is performed by using an exclusive ashing apparatus.

Figure 8:
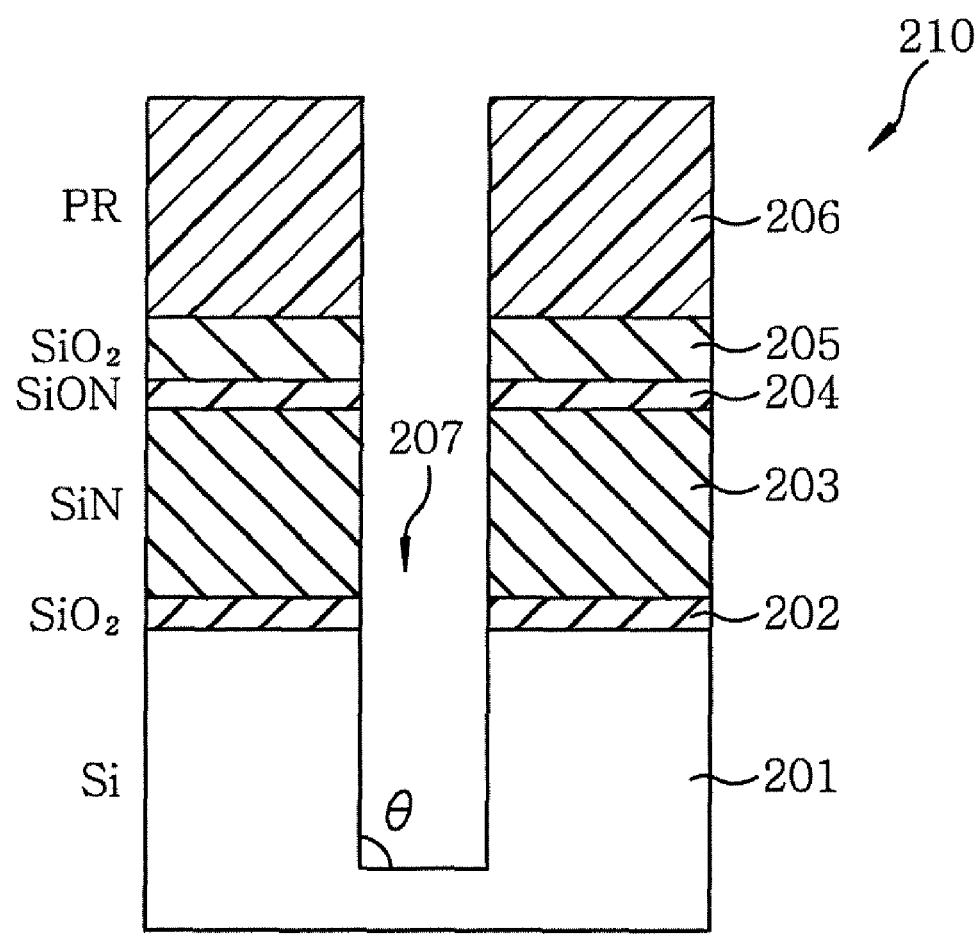
FIG. 8 shows a cross section of the etched semiconductor wafer.

In contrast, in accordance with the plasma etching method of the present embodiment, the plasma etching apparatus 100 is used, and the etching of the silicon oxide ($SiO_2$) film 205, the silicon oxynitride (SiON) film 204, the silicon nitride ($Si_3N_4$) film 203, and the silicon oxide ($SiO_2$) film 202 is performed at a stretch by using a processing gas including a fluorocarbon gas, a hydrofluorocarbon gas, a rare gas and an $O_2$ gas, for example, a gaseous mixture of $CF_4/CHF_3/Ar/O_2$. By etching the laminated films at a stretch, the trench 207 for burying therein an insulating film in the silicon substrate 201 shown in FIG. 8 can be formed by performing a single step etching process.

As apparent from the above first and second embodiments, by way of using a single etching apparatus with the specific gaseous mixture of the process gas, the laminated structure including at least a silicon layer and an insulating film can be etched by performing a single step etching process thereto, thus reducing the number of apparatuses by using them in common and greatly reducing the number of processing steps and the processing time.

Hereinafter, there will be described experimental examples of the present invention, but the present invention is not limited thereto.

EXAMPLE 1

An etching was performed on the target object 110 of a laminated structure shown in FIG. 5 by using the plasma etching apparatus 100 and a gaseous mixture of $CF_4/CHF_3/Ar/O_2$ as an etching gas, forming the recess 108 by using the resist film (PR) 107 as a mask. Herein, the resist film (PR) 107 was of a film thickness of 400 nm and was formed of a material including elements: C, H, F and O. The anti-reflection film (BARC) 106 was of a film thickness of 58 nm, the silicon nitride film ($Si_3N_4$ film) 105 was of a film thickness of 60 nm, and the polycrystalline silicon layer 104 was of a film thickness of 65 nm. Further, the line-and-space pattern of the resist film (PR) 107 was of a line width of 0.6 μm and a space width of 0.24 μm.

Etching conditions are described as follows:
$CF_4/CHF_3/Ar/O_2$=20/25/300/10 mL/min (sccm)
Pressure=13.3 Pa (100 mTorr)
RF frequency (the high frequency power supply 15)=13.56 MHz
RF power=400 W (1.27 W/cm²)
Backside pressure (central portion/edge portion)=1066 Pa/2000 Pa (⅛/15 Torr; He gas)
Distance between the upper electrode and the lower electrode=27 mm
Temperature (upper electrode/chamber sidewall/lower electrode)=60° C./60° C./30° C.
Etching time=111 seconds.
The etching results are provided in Table 1.

An upper CD (critical dimension of an interface between the anti-reflection film (BARC) 106 and the silicon nitride film 105) was 270 nm in both cases of the central portion and the edge portion of the wafer W (see, FIG. 9C), resulting in the etching uniformity in the surface of the wafer W. From the residual film thickness of the resist film (PR) 107, it is noted that the sufficient selectivity against the resist mask was achieved. Further, the "flat" of the residual film thickness of the resist film in Table 1 indicates a film thickness of a planar surface of the resist film (PR) 107 (total thickness of the resist film), whereas the "facet" indicates a film thickness of the total thickness of the resist film (PR) 107 reduced by the thickness of a shoulder cut, in the event that an edge portion of the resist film (PR) 107 was worn away due to an operation of an ion sputter, i.e. the shoulder cut occurred.

TABLE 1

|  | Position on the wafer | |
|---|---|---|
|  | Central portion | Edge portion |
| Upper CD [nm] | 270 | 270 |
| Etching depth [nm] | 158 | 136 |
| Residual film thickness of the resist film (flat) [nm] | 250 | 252 |
| Residual film thickness of the resist film (facet) [nm] | 214 | 222 |

EXAMPLE 2

An etching was performed on the target object 210 of a laminated structure shown in FIG. 5 by using the plasma etching apparatus 100 and a gaseous mixture of $CF_4/CHF_3/$ Ar/O$_2$ as an etching gas, forming the trench 207 by using the resist film (PR) 206 as a mask. Herein, the resist film (PR) 206 was of a film thickness of 320 nm and was formed of a material including elements: C, H, F and O. The silicon oxide (SiO$_2$) film 205 was of a film thickness of 20 nm, the silicon oxynitride (SiON) film 204 was of a film thickness of 32 nm, the silicon nitride (Si$_3$N$_4$) film 203 was of a film thickness of 265 nm, and the silicon oxide (SiO$_2$) film 202 was of a film thickness of 8 nm. Further, the pattern of the resist film (PR) 206 was of a line width of 0.17 μm and a trench width of 0.18 μm.

Etching conditions given are as follows:
CF$_4$/CHF$_3$/Ar/O$_2$=20/25/300/10 mL/min (sccm)
Pressure=13.3 Pa (100 mTorr)
RF frequency (the high frequency power supply 15)=13.56 MHz
RF power=400 W (1.27 W/cm$^2$)
Backside pressure (central portion/edge portion)=933 Pa/5332 Pa (7/40 Torr; He gas)
Distance between the upper electrode and the lower electrode=27 mm
Temperature (upper electrode/lower electrode)=60° C./30° C.
Etching time=130 seconds.

The etching results are provided in Table 2.

An upper CD (critical dimension of an interface between the silicon oxide film 202 and the silicon nitride film 203 in this example) was 206 nm in both cases of the central portion and the edge portion of the wafer W, and a CD of a bottom portion of the trench 207 was 174 nm, resulting in the etching uniformity on the surface of the wafer W.

Further, both of the central portion and the edge portion of the wafer W had an identical depth of the trench 207 formed in the silicon substrate 201 and an identical sidewall angle (180°−θ; see, FIG. 8), thereby yielding a high in-surface uniformity of the etching shape.

TABLE 2

|  | Position on the wafer | |
| --- | --- | --- |
|  | Central portion | Edge portion |
| Upper CD [nm] | 206 | 206 |
| CD of the bottom portion of the trench [nm] | 174 | 174 |
| Trench sidewall angle [°] | 87.1 | 87.1 |
| Etching depth of silicon [nm] | 58 | 58 |

Next, an influence of the etching conditions on the etching rate, the selectivity against the mask, and the etching shape was examined. In this examination, the sample wafer of a laminated structure shown in FIG. 9A was used. The sample wafer was of a structure in which a silicon oxide (SiO$_2$) film 302, a silicon nitride (Si$_3$N$_4$) film 303, and a resist film 304 were stacked on a silicon substrate 301. Further, by using a gaseous mixture of CF$_4$/CHF$_3$/Ar/O$_2$ as a processing gas, and changing the etching conditions based on a design of experiment as shown in Table 3, an etching process was performed to form a recess 305. At that time, the etching rate, the selectivity against the mask, and the etching shape were measured and compared.

Furthermore, as the other etching conditions, the RF frequency (the high frequency power supply 15) was set to be 13.56 MHz, the RF power was set to be 300 W (0.96 W/cm$^2$), the backside pressure (central portion/edge portion) was set to be 933 Pa/2666 Pa (7/20 Torr; He gas), the distance between the upper electrode and the lower electrode was set to be 27 mm, and the temperature (upper electrode/lower electrode) was set at 60° C./30° C.

Table 4 and FIGS. 10 to 13 show the results of the etching rate and the selectivity against the mask, while Table 5 and FIGS. 14 to 21 represent the results of the etching shape. Further, in FIGS. 10 to 13, a horizontal axis represents a CHF$_3$/Ar flow rate ratio, and a vertical axis represents a processing pressure.

TABLE 3

| Experiment | Pressure | CF$_4$ flow rate mL/min (sccm) | CHF$_3$/Ar flow rate ratio | CHF$_3$ flow rate mL/min (sccm) | Ar flow rate mL/min (sccm) | O$_2$ flow rate mL/min (sccm) |
| --- | --- | --- | --- | --- | --- | --- |
| 1 | 8 Pa (60 mTorr) | 0 | 0.019 | 23 | 1200 | 3 |
| 2 | 8 Pa (60 mTorr) | 20 | 0.058 | 46 | 800 | 6 |
| 3 | 8 Pa (60 mTorr) | 40 | 0.173 | 69 | 400 | 9 |
| 4 | 10 Pa (75 mTorr) | 40 | 0.019 | 23 | 1200 | 6 |
| 5 | 10 Pa (75 mTorr) | 0 | 0.058 | 46 | 800 | 9 |
| 6 | 10 Pa (75 mTorr) | 20 | 0.173 | 69 | 400 | 3 |
| 7 | 12 Pa (90 mTorr) | 20 | 0.019 | 23 | 1200 | 9 |
| 8 | 12 Pa (90 mTorr) | 40 | 0.058 | 46 | 800 | 3 |
| 9 | 12 Pa (90 mTorr) | 0 | 0.173 | 69 | 400 | 6 |

TABLE 4

| Experiment | Resist etching rate [nm/min] | SiO$_2$ etching rate [nm/min] | Selectivity of SiO$_2$ against the mask | SiN etching rate [nm/min] | Selectivity of SiN against the mask |
| --- | --- | --- | --- | --- | --- |
| 1 | 17.15 | 16.45 | 0.96 | 57.62 | 3.36 |
| 2 | 35.08 | 37.78 | 1.08 | 99.60 | 2.84 |
| 3 | 51.28 | 68.05 | 1.33 | 134.96 | 2.63 |
| 4 | 46.36 | 46.50 | 1.00 | 85.42 | 1.84 |
| 5 | 55.50 | 60.64 | 1.09 | 93.08 | 1.68 |
| 6 | 14.65 | 18.07 | 1.23 | 109.45 | 7.47 |
| 7 | 45.15 | 57.78 | 1.28 | 75.72 | 1.68 |
| 8 | 19.28 | 31.65 | 1.64 | 116.26 | 6.03 |
| 9 | 11.76 | 36.22 | 3.08 | 137.57 | 11.70 |

TABLE 5

| Experiment | Inclination angle difference of the sidewall by the pattern density [degree] | CD difference in the wafer surface [nm] |
| --- | --- | --- |
| 1 | −3.10 | 26 |
| 2 | −1.54 | 8 |
| 3 | −1.08 | −14 |
| 4 | 0.60 | 2 |

TABLE 5-continued

| Experiment | Inclination angle difference of the sidewall by the pattern density [degree] | CD difference in the wafer surface [nm] |
|---|---|---|
| 5 | −1.28 | 18 |
| 6 | −2.44 | 2 |
| 7 | 0.00 | 0 |
| 8 | −1.92 | −8 |
| 9 | −3.14 | 16 |

Figure 10:
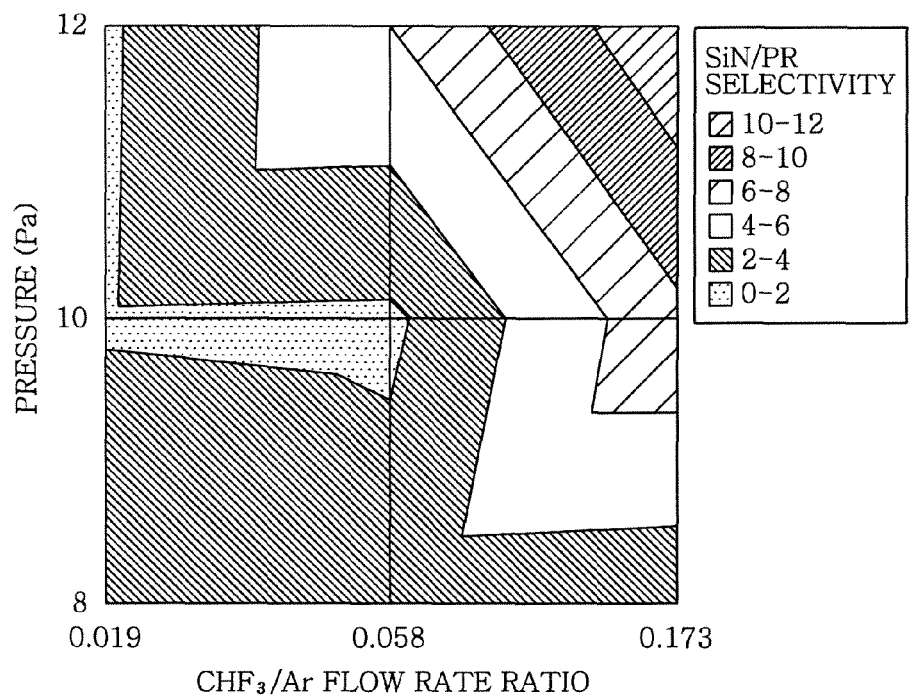
FIG. 10 represents an etching selectivity of a silicon nitride film against a resist mask in case of varying a gas flow rate ratio and a pressure.

FIG. 10 shows an etching selectivity of the silicon nitride ($Si_3N_4$) film 303 over the resist film 304. Since the selectivity against the mask equal to or greater than 1 is preferable when the silicon nitride film ($Si_3N_4$ film) 303 is etched, from FIG. 10, it is noted that the sufficient selectivity against the mask can be obtained under the specified conditions. Furthermore, by selecting conditions under which the $CHF_3/Ar$ flow rate ratio and the processing pressure are high, i.e. an upper right portion of FIG. 10, the selectivity against the mask can be more enhanced.

Figure 11:
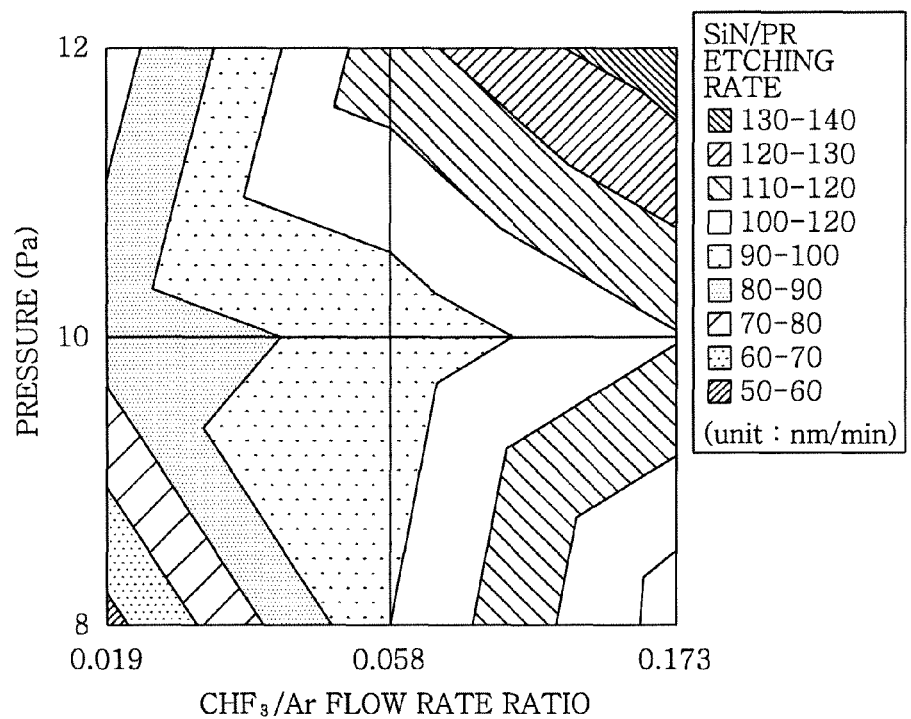
FIG. 11 shows an etching rate of the silicon nitride film in case of varying a gas flow rate ratio and a pressure.

FIG. 11 illustrates an etching rate of the silicon nitride ($Si_3N_4$) film 303. From FIG. 11, it is noted that the processing pressure is not an effective condition to improve the etching rate of the silicon nitride ($Si_3N_4$) film 303. Instead, increasing the $CHF_3/Ar$ flow rate ratio in the specified conditions is effective.

Figure 12:
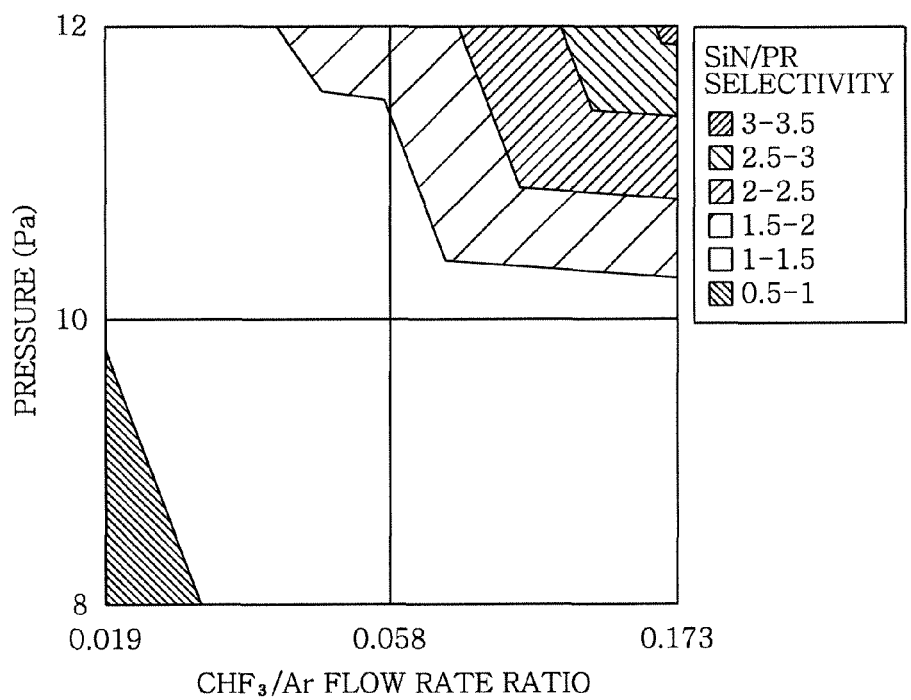
FIG. 12 illustrates an etching selectivity of silicon against a resist mask in case of varying a gas flow rate ratio and a pressure.

FIG. 12 shows an etching selectivity of the silicon substrate 301 over the resist film 304. Since the etching selectivity of the silicon against the mask equal to or greater than 1 is preferable, from FIG. 12, it is noted that the sufficient selectivity against the mask can be obtained under the specified conditions. Furthermore, by selecting conditions where the $CHF_3/Ar$ flow rate ratio and the processing pressure are high, i.e. an upper right portion of FIG. 12, the selectivity of the silicon etching against the mask can be further enhanced.

Figure 13:
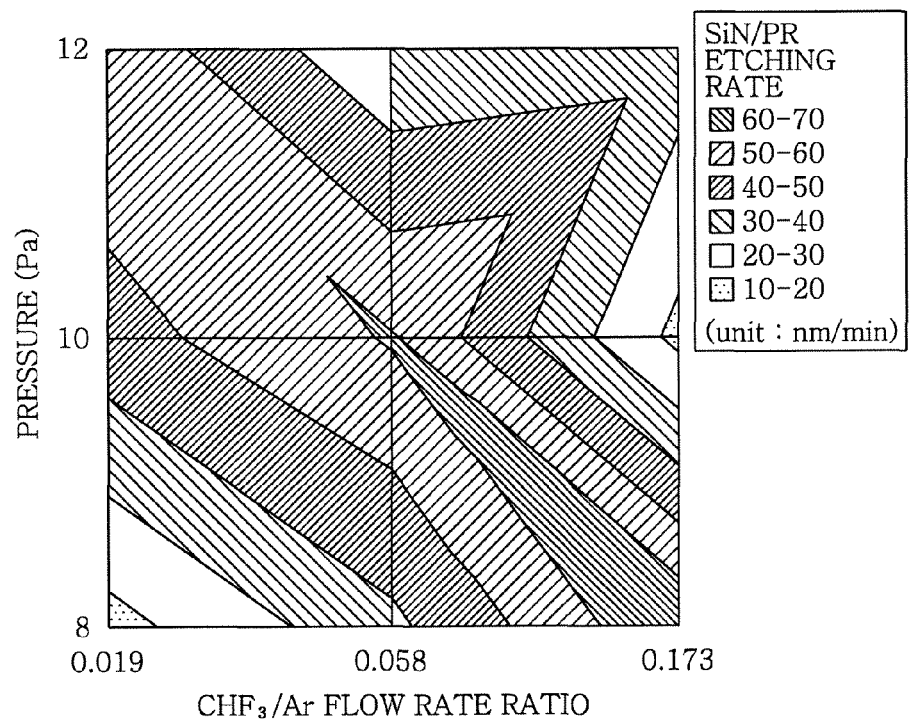
FIG. 13 represents an etching rate of the silicon in case of varying a gas flow rate ratio and a pressure.

FIG. 13 illustrates an etching rate of the silicon substrate 301. From FIG. 13, it is noted that, under the specified conditions, the high etching rate can be obtained under the low processing pressure in case of the high $CHF_3/Ar$ flow rate ratio, whereas the high etching rate can be obtained under the high processing pressure if the $CHF_3/Ar$ flow rate ratio is low.

Consequently, to enhance the selectivity against the mask when etching the silicon nitride ($Si_3N_4$) film 303 and the silicon substrate 301, it is effective that the $CHF_3/Ar$ flow rate ratio as well as the pressure is set to be high under the conditions of Table 3. In this case, the etching rate of the silicon nitride ($Si_3N_4$) film 303 can be also increased. On the other hand, if the etching rate of the silicon substrate 301 is considered important, as shown in FIG. 13, it is desirable to change the $CHF_3$ flow rate or the processing pressure during etching, taking into account that the low processing pressure in case of the high $CHF_3/Ar$ flow rate ratio and the high processing pressure in case of the high $CHF_3/Ar$ flow rate ratio are preferable.

For example, in the step of etching the silicon nitride ($Si_3N_4$) film 303, both the pressure and the $CHF_3/Ar$ flow rate ratio are set to be high under the conditions of Table 3 in order to obtain the sufficient selectivity against the mask and etching rate. However, in the step of etching the silicon after the recess 305 reaches the silicon substrate 301, reducing the processing pressure while maintaining the $CHF_3$ flow rate or reducing the $CHF_3$ flow rate while maintaining the processing pressure can improve the etching rate of the silicon substrate 301. In both cases, since the etching selectivity of the silicon against the mask which is equal to or greater than 1 is preferable, it is considered that the selectivity against the mask is not likely to be deteriorated from the results of FIG. 12.

On the other hand, in the step of etching the silicon nitride film ($Si_3N_4$ film) 303, it is also possible to set both the processing pressure and the $CHF_3/Ar$ flow rate ratio to be low under the conditions of Table 3. In this case, in the step of etching the silicon after the recess 305 reaches the silicon substrate 301, for example, increasing the processing pressure while maintaining the $CHF_3$ flow rate or increasing the $CHF_3$ flow rate while maintaining the processing pressure can improve the etching rate of the silicon substrate 301.

Next will be described the inclination angle difference of the sidewall caused by a difference in the pattern density of Table 5 and the results of FIGS. 14 to 17 corresponding thereto.

In order to confirm the uniformity of the etching shape on the surface of the wafer W, the results in Table 5 were obtained by measuring the inclination angle difference of the sidewall of the groove in the device with the following method. By measuring an inclination angle $\theta_1$ of the sidewall of the recess 305 in the dense pattern region and an inclination angle $\theta_2$ of the sidewall of the recess 305 in the sparse pattern region, as shown in FIG. 9B, and calculating the difference (the inclination angle $\theta_2$ of the sidewall in the sparse pattern region— the inclination angle $\theta_1$ of the sidewall in the dense pattern region), the inclination angle difference of the sidewall was derived.

FIGS. 14 to 17 provide variance analysis of the results of the inclination angle difference of the sidewall in Table 5. From FIGS. 14 to 17, variation tendency of the inclination angle difference of the sidewall with respect to variation of each process parameter such as the pressure, the $CF_4$ flow rate, the $CHF_3/Ar$ flow rate ratio and the $O_2$ flow rate can be demonstrated.

Figure 9A:
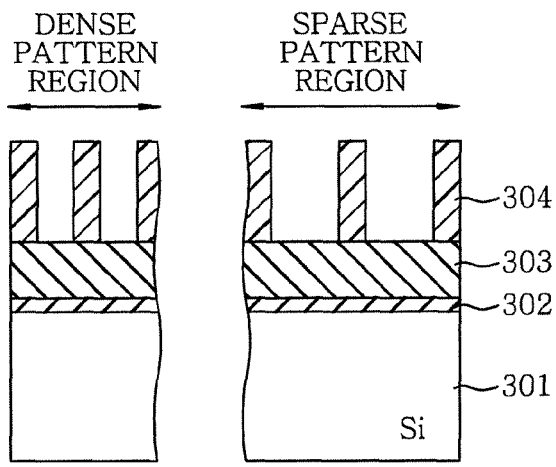
Figure 9B:
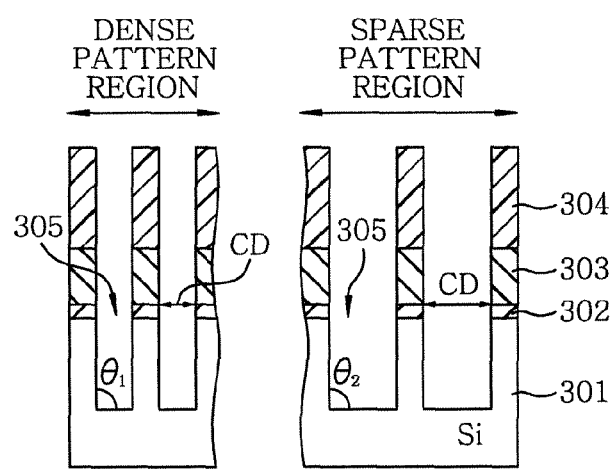
Figure 9C:
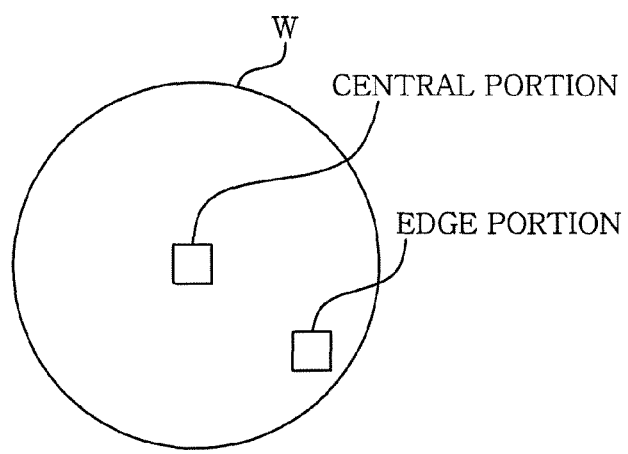

More specifically, as shown in FIGS. 9A to 9C, the inclination angle of the sidewall was measured at each of three sparse pattern regions in both the central portion and the edge portion of the wafer W and an average thereof was calculated. In the same manner, the inclination angle of the sidewall was measured at each of three dense pattern regions in both the central portion and the edge portion of the wafer W and an average thereof was calculated. After that, the difference between the average of the inclination angles of the sidewalls in the sparse pattern region and the average of the inclination angles of the sidewalls in the dense pattern region was calculated to be represented by a vertical axis of each graph in FIGS. 14 to 17. A small absolute value of the vertical axis indicates that the inclination angle difference of the sidewall by the pattern density is small.

Figure 14:
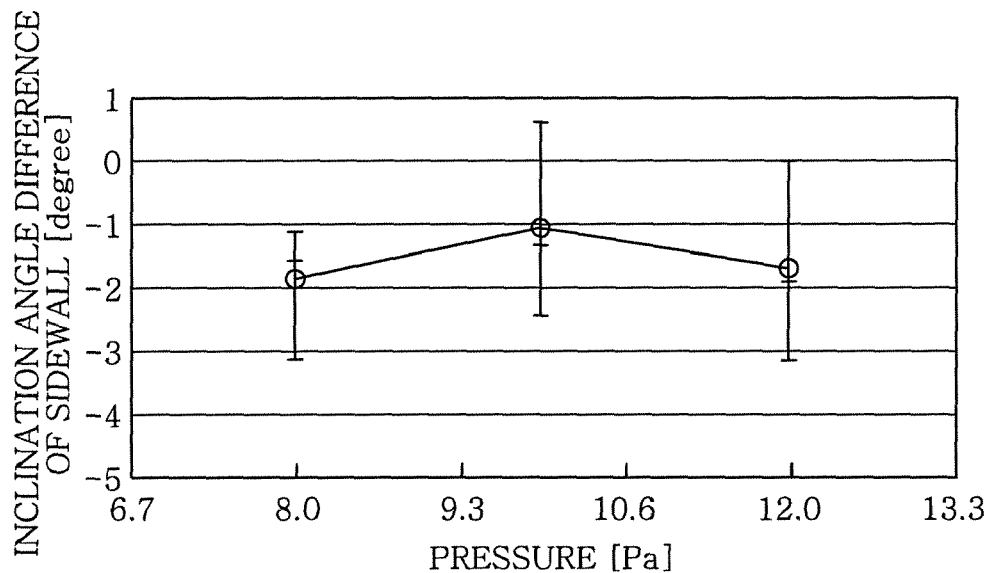
FIG. 14 shows a change in an inclination angle difference of a sidewall caused by a difference in a pattern density in case of varying a pressure.

As can be seen from FIG. 14, the pressure of 9.3~10.6 Pa (70~80 mTorr) is preferable under the specified conditions. However, if the pressure is greater or less than the above pressure range, the inclination angle difference of the sidewall by the pattern density tends to increase.

Figure 15:
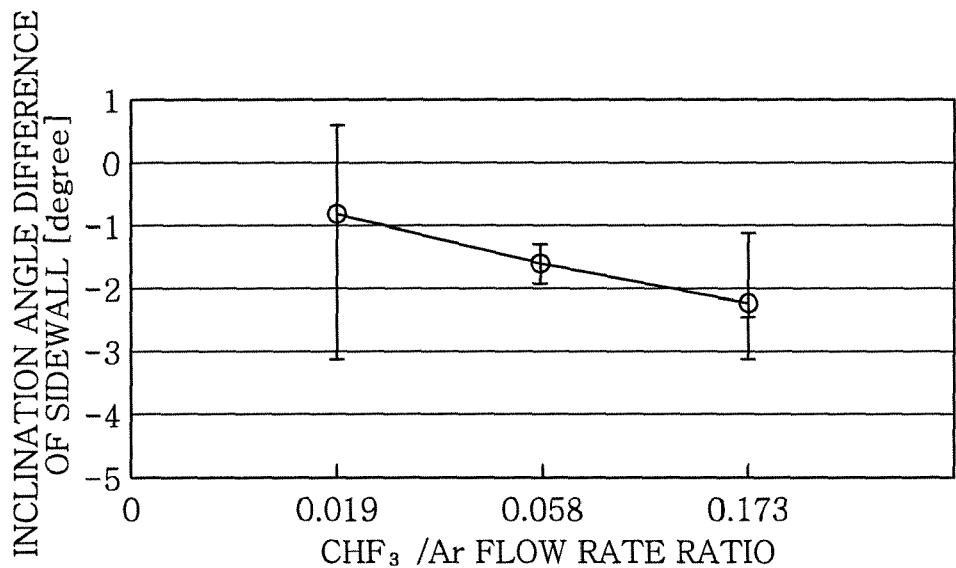
FIG. 15 illustrates a change in the inclination angle difference of the sidewall caused by a difference in the pattern density in case of varying a $CHF_3/Ar$ flow rate ratio.

Further, from FIG. 15, as the $CHF_3/Ar$ flow rate ratio of the $CHF_3$ gas to the Ar gas becomes higher, i.e. the flow rate of the $CHF_3$ gas increases, the inclination angle difference of the sidewall by the pattern density tends to increase. Accordingly, it can be known that the inclination angle difference of the sidewall is not reduced by the $CHF_3/Ar$ flow rate ratio.

Figure 16:
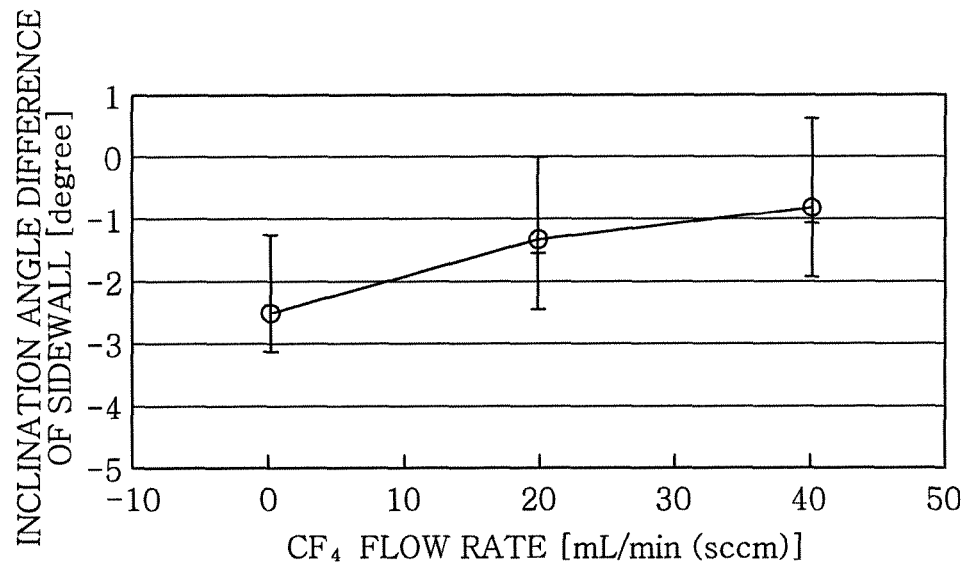
FIG. 16 shows a change in the inclination angle difference of the sidewall caused by a difference in the pattern density in case of varying a $CF_4$ flow rate.
Figure 17:
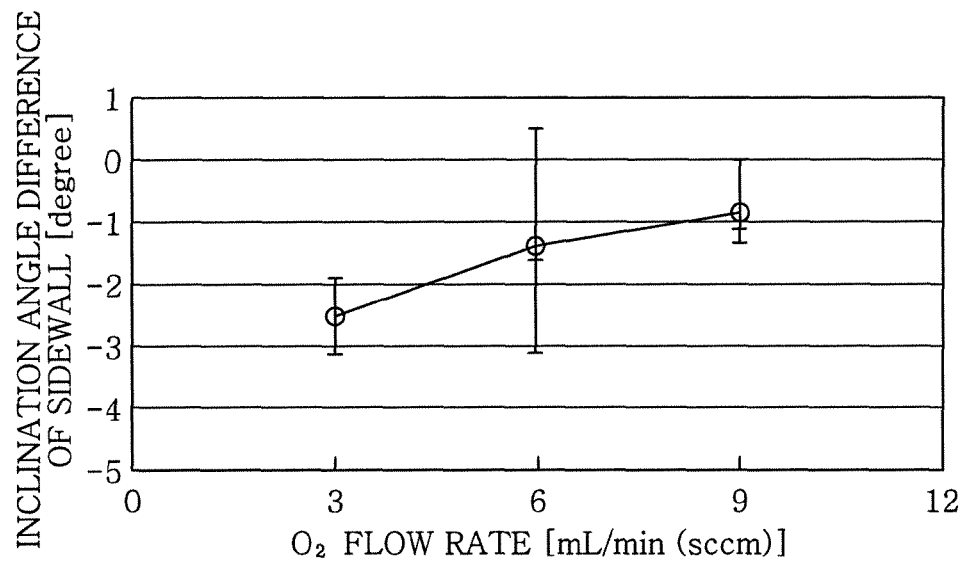
FIG. 17 represents a change in the inclination angle difference of the sidewall caused by a difference in the pattern density in case of varying an $O_2$ flow rate.

On the other hand, as can be seen from FIG. 16, by increasing the $CF_4$ flow rate under the specified conditions, the inclination angle difference of the sidewall caused by the difference in the pattern density tends to decrease. Likewise, as can be seen from FIG. 17, by increasing the $O_2$ flow rate under the specified conditions, the inclination angle difference of the sidewall caused by the difference in the pattern density tends to decrease. Accordingly, it is confirmed that the inclination angle difference of the sidewall caused by a difference in the pattern density can be controlled by adjusting the $CF_4$ flow rate and/or the $O_2$ flow rate.

Hereinafter will be described the CD difference in the wafer surface in Table 5 and the results shown in FIGS. 18 to 21 corresponding thereto.

In order to confirm the uniformity of the etching shape on the surface of the wafer W, the results shown in Table 5 were obtained by measuring the critical dimension (CD) difference in the wafer surface with the following method. As illustrated in FIG. 9B, the CD can be derived by measuring a width at an interface between the silicon oxide film ($SiO_2$ film) 302 and the silicon nitride film ($Si_3N_4$ film) 303.

More specifically, the CD was measured at each of three regions in both the central portion and the edge portion of the wafer W and an average thereof was calculated. After that, the CD difference in the wafer surface of Table 5 was derived from the difference between the CD average of the central portion and the CD average of the edge portion. FIGS. 18 to 21 provide variance analysis of the results of the CD difference of Table 5. From FIGS. 18 to 21, variation tendency of the CD difference in the wafer surface with respect to variation of each process parameter such as the pressure, the $CF_4$ flow rate, the $CHF_3$/Ar flow rate ratio and the $O_2$ flow rate can be demonstrated. Further, a vertical axis of each graph is represented by the CD difference in the wafer surface (unit: nm).

Figure 18:
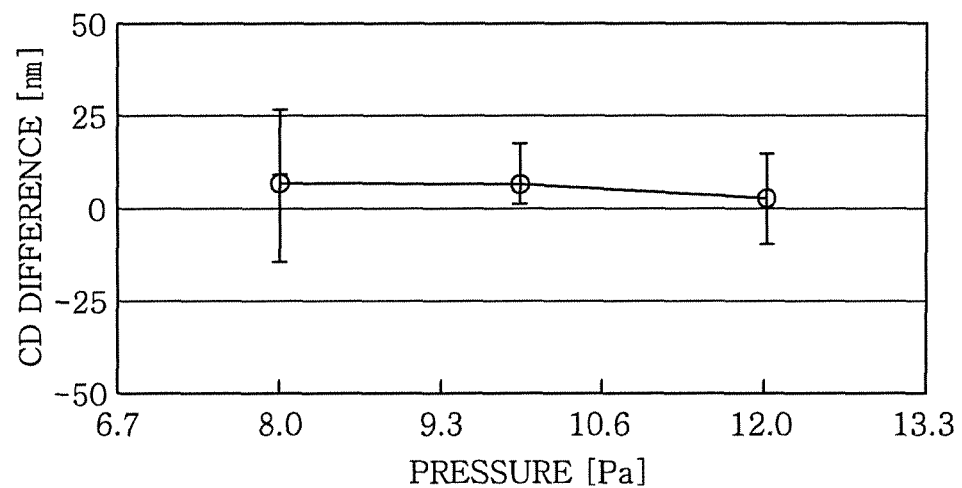
FIG. 18 describes a change in a critical dimension difference caused by a difference in a position in a wafer surface in case of varying a pressure.
Figure 19:
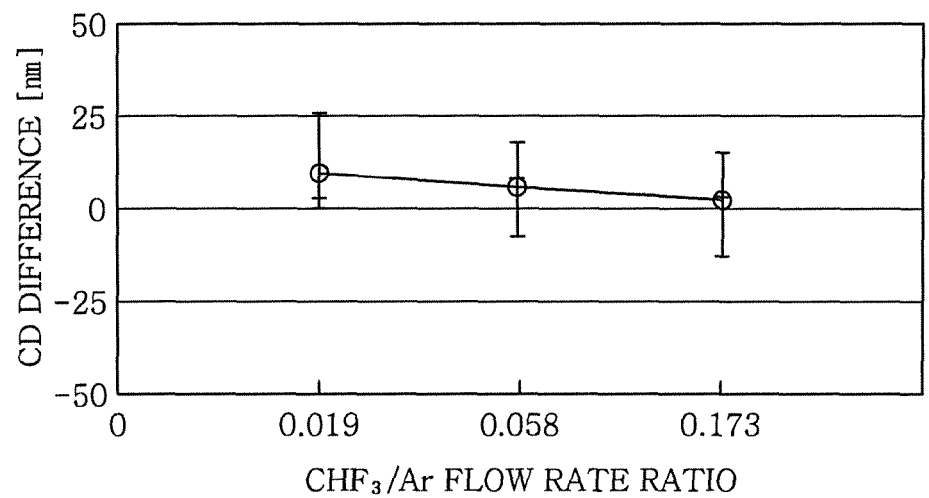
FIG. 19 shows a change in the critical dimension difference caused by a difference in the position in the wafer surface in case of varying a $CHF_3/Ar$ flow rate ratio.
Figure 21:
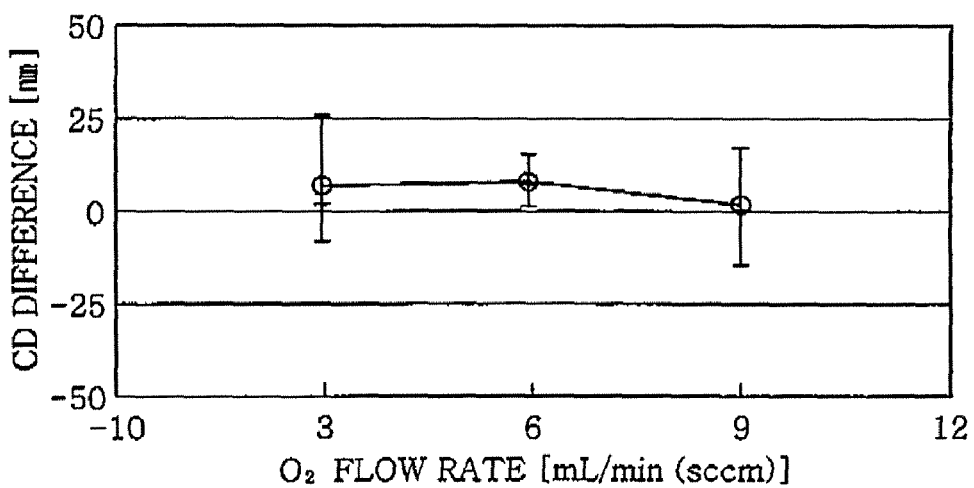
FIG. 21 depicts a change in the critical dimension difference caused by a difference in the position in the wafer surface in case of varying an $O_2$ flow rate.

As can be seen from FIGS. 18 and 21, the graphs show no significant change with respect to the processing pressure and the $O_2$ flow rate under the specified conditions. From FIG. 19, as the $CHF_3$/Ar flow rate ratio increases under the specified conditions, i.e. the amount of the $CHF_3$ increases, the CD difference tends to decrease. Namely, this indicates that the CD difference in the surface can be controlled by adjusting the $CHF_3$/Ar flow rate ratio.

Figure 20:
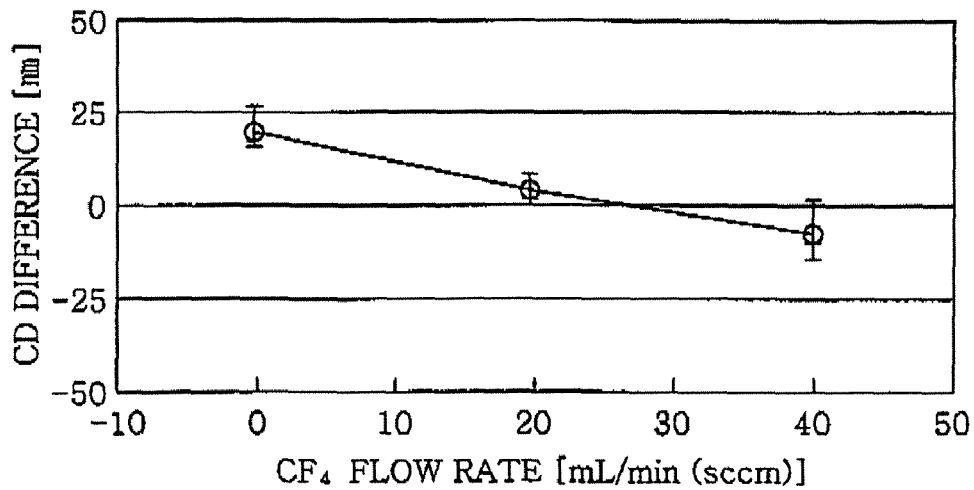
FIG. 20 illustrates a change in the critical dimension difference caused by a difference in the position in the wafer surface in case of varying a $CF_4$ flow rate.

Furthermore, from FIG. 20, as the $CF_4$ flow rate increases under the specified conditions, the CD difference in the surface tends to decrease. Accordingly, it is apparent that the CD difference in the surface may be controlled by adjusting the $CF_4$ flow rate.

Consequently, referring to FIGS. 14 to 21, in order to ameliorate the inclination angle difference of the sidewall caused by a difference in the pattern density and the CD difference caused by a difference in the position in the surface, it is effective to adjust the $CF_4$ flow rate. For this, for example, the $CF_4$ flow rate is preferably set to be in the range of 20~40 mL/min (sccm). On the other hand, in order to improve the inclination angle difference of the sidewall caused by a difference in the pattern density, it is also effective to adjust the $O_2$ flow rate. For this, for example, the $O_2$ flow rate is preferably set to be 6~15 mL/min (sccm).

As discussed above, in accordance with the plasma etching method of the present invention, it is possible to etch the laminated films including the insulating film and the silicon layer by using the resist film as a mask with a single step etching process. Thereby, the processes for forming the gate electrode of the transistor or the trench for device isolation by STI can be greatly shortened.

Furthermore, by suppressing the variation of the etching shape in the surface of the wafer W or the variation of the etching shape caused by a difference in the pattern density, the uniformity of the etching shape can be obtained.

Accordingly, the plasma etching method of the present invention can be suitably applied to various semiconductor fabrication techniques.

Although the preferred embodiments of the present invention have been described, the various modifications may be made without being limited thereto. For example, in the above preferred embodiments, the dipole ring magnet is employed as a magnetic field generating unit of the magnetron RIE plasma etching apparatus, but the present invention is not limited thereto. Furthermore, the magnetic field does not have to be formed. Moreover, every plasma etching apparatus capable of forming plasma by the gaseous mixture of the present invention such as a capacitively coupled or inductively coupled plasma etching apparatus can be used.

The present invention can be appropriately used in the manufacturing process of, e.g., a semiconductor device such as a transistor.

While the invention has been shown and described with respect to the preferred embodiments, it will be understood by those skilled in the art that various changes and modifications may be made without departing from the spirit and scope of the invention as defined in the following claims.

What is claimed is:

1. A plasma etching method comprising the step of:
etching a silicon nitride film, a silicon oxide film, and a silicon layer of a target object by using a plasma generated from a processing gas containing a fluorocarbon gas, a hydrofluorocarbon gas, a rare gas and an $O_2$ gas and by employing a patterned resist film as a mask,
wherein the target object includes the silicon nitride film, the silicon oxide film, the silicon layer whose main component is silicon and the patterned resist film formed over the silicon layer.

2. A plasma etching method comprising the step of:
etching a silicon nitride film, a silicon oxide film, and a silicon layer of a target object at a stretch by using a plasma generated from a processing gas containing a fluorocarbon gas, a hydrofluorocarbon gas, a rare gas and an $O_2$ gas and by employing a patterned resist film as a mask in a processing chamber of a plasma processing apparatus,
wherein the target object includes the silicon layer whose main component is silicon, and further includes at least the silicon oxide film, the silicon nitride film and the patterned resist film laminated over the silicon layer.

3. The plasma etching method of claim 2, wherein the fluorocarbon gas is a $CF_4$ gas, a $C_2F_6$ gas, a $C_3F_8$ gas, or a $C_4F_8$ gas.

4. The plasma etching method of claim 2, wherein the hydrofluorocarbon gas is a $CHF_3$ gas, a $CH_2F_2$ gas, or a $CH_3F$ gas.

5. The plasma etching method of claim 2, wherein a flow rate of the fluorocarbon gas is 10-50 mL/min.

6. The plasma etching method of claim 2, wherein a flow rate of the $O_2$ gas is 1-30 mL/min.

7. The plasma etching method of claim 2, wherein a flow rate ratio of the hydrofluorocarbon gas to the rare gas (hydrofluorocarbon gas flow rate/rare gas flow rate) is 0.019-0.173.

8. The plasma etching method of claim 2, wherein a processing pressure is 8-12 Pa.

9. The plasma etching method of claim 2, wherein critical dimensions after respectively etching in a dense pattern region and in a sparse pattern region are controlled by a flow rate of the fluorocarbon or $O_2$ gas.

10. The plasma etching method of claim 2, wherein a critical dimension after etching in a surface of the target object is controlled by a flow rate of the fluorocarbon gas.

11. The plasma etching method of claim 2, wherein a processing pressure in etching the silicon layer is lower than that in etching the silicon nitride film.

12. The plasma etching method of claim 2, wherein a flow rate of the hydrofluorocarbon gas in etching the silicon layer is lower than that in etching the silicon nitride film.

13. The plasma etching method of claim 2, wherein the silicon layer is mainly made of polycrystalline silicon or single crystalline silicon.

14. The plasma etching method of claim 1, wherein a flow rate of the fluorocarbon gas is 20-40 mL/min.

15. The plasma etching method of claim 1, wherein a flow rate of the $O_2$ gas is 6-15 mL/min.

16. The plasma etching method of claim 1, wherein a gas flow rate ratio of the hydrofluorocarbon gas to the rare gas is 0.019-0.173.

17. The plasma etching method of claim 5, wherein a flow rate of the fluorocarbon gas is 20-40 mL/min.

18. The plasma etching method of claim 6, wherein a flow rate of the $O_2$ gas is 6-15 mL/min.

19. The plasma etching method of claim 1, wherein the silicon layer is a polycrystalline silicon layer formed over the silicon nitride film and the silicon oxide film.

20. The plasma etching method of claim 1, wherein the silicon nitride film, the silicon oxide film and the silicon layer is etched in a single plasma etching apparatus.

* * * * *